US006509751B1

(12) United States Patent
Mathieu et al.

(10) Patent No.: US 6,509,751 B1
(45) Date of Patent: Jan. 21, 2003

(54) PLANARIZER FOR A SEMICONDUCTOR CONTACTOR

(75) Inventors: Gaetan L. Mathieu, Livermore; Benjamin N. Eldridge, Danville; Gary W. Grube, Pleasanton, all of CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/528,064

(22) Filed: Mar. 17, 2000

(51) Int. Cl.[7] ................................. G01R 31/02
(52) U.S. Cl. ........................................ 324/754
(58) Field of Search ................... 324/761, 754; 439/67, 66; 361/772, 774

(56) References Cited

U.S. PATENT DOCUMENTS 5,094,536 A    3/1992   MacDonald 5,974,662 A  * 11/1999   Eldridge et al. ............. 29/842

FOREIGN PATENT DOCUMENTS

WO    WO96/15458    5/1996

* cited by examiner

*Primary Examiner*—N. Le
*Assistant Examiner*—Etienne P LeRoux
(74) *Attorney, Agent, or Firm*—Sterne, Kessler, Goldstein & Fox, PLLC

(57) ABSTRACT

A planarizer for a probe card assembly. A planarizer includes a first control member extending from a substrate in a probe card assembly. The first control member extends through at least one substrate in the probe card assembly and is accessible from an exposed side of an exterior substrate in the probe card assembly. Actuating the first control member causes a deflection of the substrate connected to the first control member.

25 Claims, 6 Drawing Sheets

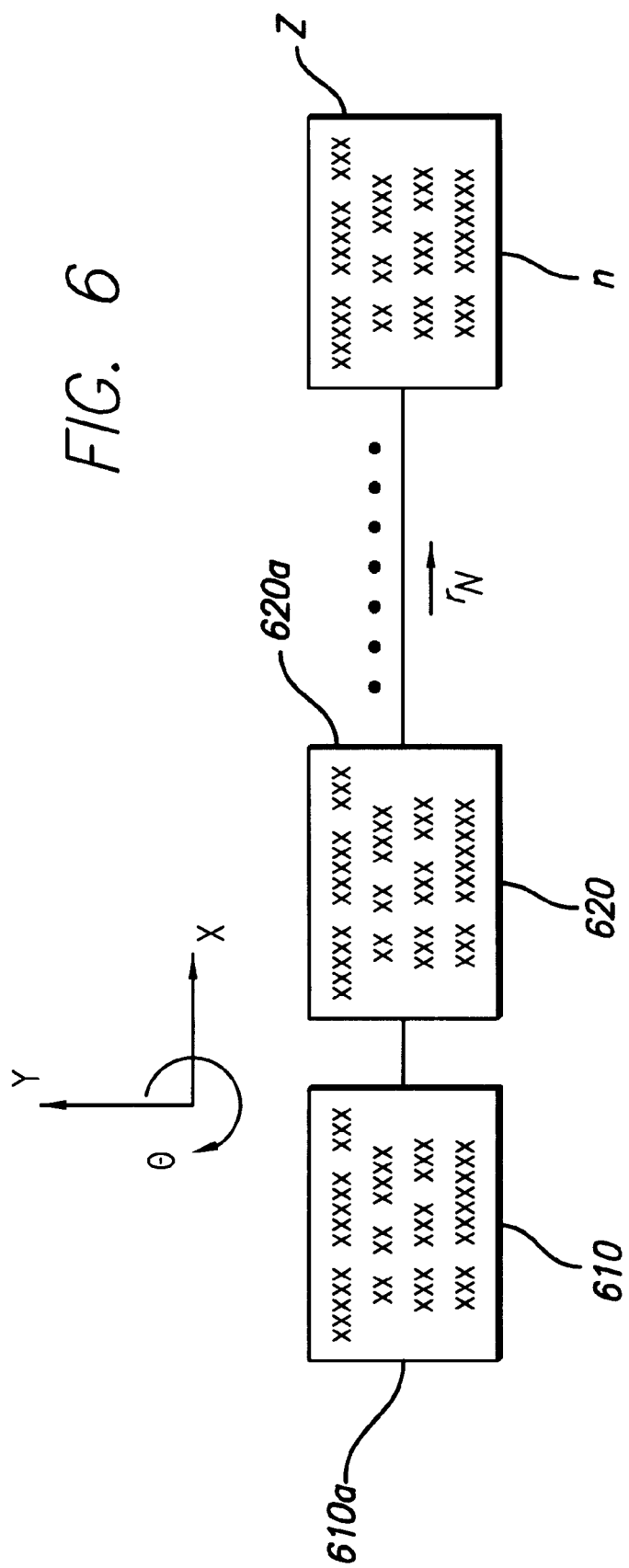

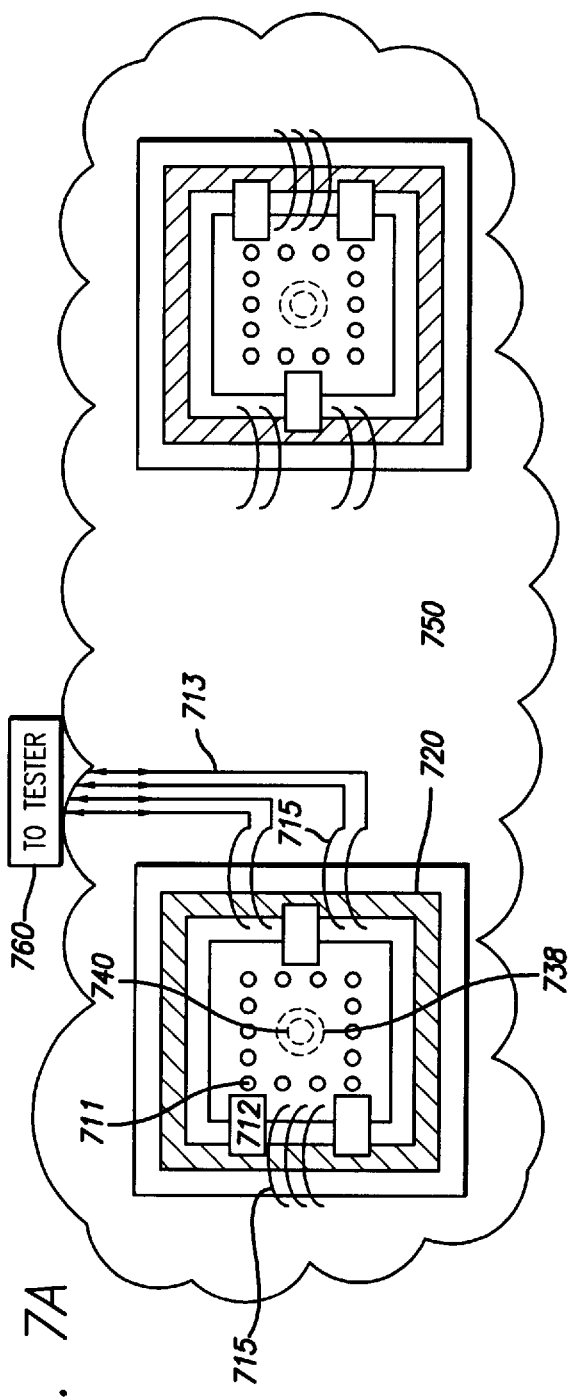
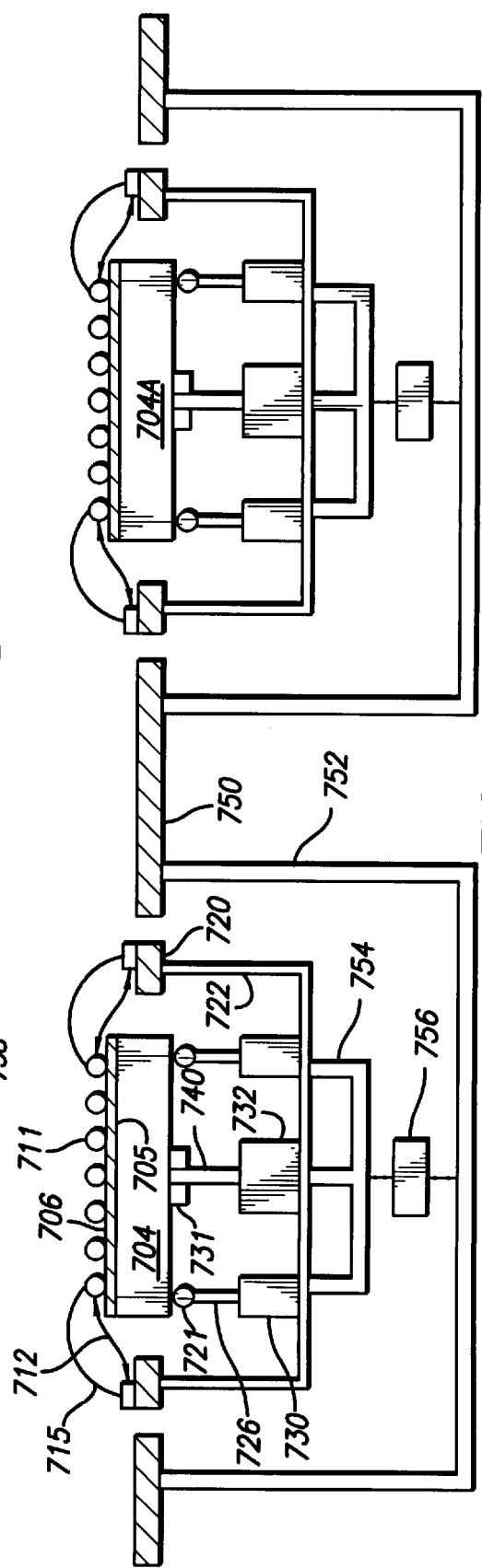
FIG. 7A
FIG. 7B

PLANARIZER FOR A SEMICONDUCTOR CONTACTOR

BACKGROUND OF THE INVENTION

1. Field of the Invention

The present invention relates generally to a probe card assembly, and more specifically to achieving a more planar relationship between the contact elements on a probe card assembly and a device under test.

2. Background Information

Individual semiconductor devices (dies) are typically produced by creating several identical devices on a semiconductor wafer, using commonly known techniques such as photolithography and deposition. Generally, these processes are intended to create fully functional integrated circuit devices, prior to separating the individual dies from the semiconductor wafer. However, physical defects in the wafer and defects in the processing of the wafer often lead to the presence of some defective dies on the wafer. It is desirable to be able to identify the defective dies prior to packaging or prior to their separation from the wafer. To perform such identification, wafer testers or probers are used to make pressure connections to connection pads (bond pads) on the dies. The dies can then be tested for defects. A conventional component of a wafer tester is a probe card which has contact elements that effect the pressure connections to the bond pads of the dies.

A probe card can be part of a probe card assembly, such as that which is described in U.S. Pat. No. 5,974,662, titled "Method of Planarizing Tips of Probe Elements of a Probe Card Assembly," which is incorporated by reference herein. A probe card assembly according to U.S. Pat. No. 5,974,662 typically includes a number of components in addition to the probe card itself, such as an interposer and a space transformer. The interposer is disposed between the probe card and the space transformer and allows the orientation of the space transformer to be adjusted relative to the orientation of the probe card.

The space transformer permits a plurality of contact structures on one side of the space transformer to make contact with the terminals of an electronic component (e.g. bond pads on a semiconductor device) at a relatively fine pitch, while connections to another side of the space transformer are made at a relatively coarser pitch. In a preferred embodiment, the contact structures make contact with an active semiconductor device, such as a wafer. Such connections can be disrupted by slight variations in the planarity of the space transformer. Unfortunately, variations in the planarity of the space transformer can occur, for example, when the space transformer is manufactured. For example, an edge of the space transformer might be bent slightly or the center of the space transformer might be bowed.

FIG. 1 illustrates generally a prior art technique for adjusting the orientation of a space transformer. A space transformer 110 is shown with different sets of adjustment points on the bottom of space transformer 110. In one example, the adjustment points correspond to the locations of ball bearings that can be pressed against a back surface of space transformer 110 to adjust the orientation of space transformer 110. In FIG. 1, three adjustment points 112a–112c are used to adjust the orientation of space transformer 110. Adjustment points 112a–112c are located along the periphery of space transformer 110.

The adjustment points shown in FIG. 1 can be used to deflect peripheral areas of space transformer 110, but they cannot be used to deflect non-peripheral areas, such as the center, of space transformer 110. The three points of adjustment shown in FIG. 1 define a plane which is approximately parallel to the plane of a front surface of space transformer 110. However, because there are only three adjustment points, they can adjust the orientation, but not the shape, of space transformer 110; geometric changes are made on only a low order ($1^{st}$ order polynomial). Furthermore, using ball bearings in conjunction with the adjustment points provides for the application of only a pushing force against space transformer 110, and in some instances, the pushing force is opposed by a spring member on an opposite side of space transformer 110.

In many instances, it is desirable to be able to apply a pulling or pushing force at a multiplicity of locations on a space transformer because the space transformer may require deflection or distortion over its surface to achieve better planarity and correct surface variations.

SUMMARY OF THE INVENTION

The present invention provides, in one embodiment, a probe card assembly having a substrate, a plurality of contact elements located on the substrate, and a planarizing member which, when applied to the substrate, is capable of applying a pushing or pulling force at different locations on the substrate to achieve a desired deformation of the substrate.

In another embodiment, a substrate, which is for use with a probe card assembly, has more than three adjustment points relative to a printed wiring board in the probe card assembly. The adjustment points allow for a plurality of areas of the substrate to be adjusted relative to the printed wiring board and relative to other areas of the substrate.

In yet another embodiment, a probe card assembly includes a probe card, a substrate, and a first control member extending from the substrate to the probe card. The first control member extends through the probe card and causes the substrate to deflect when the first control member is actuated. In one embodiment of the present invention, the first control member is coupled to a central area of the substrate.

In still another embodiment of the present invention, a planarizing apparatus includes a connector which has a first end and a second end, the first end being couplable to a first substrate, such as a space transformer, of a probe card assembly. The planarizing apparatus also includes an actuating assembly which is movably coupled to the second end of the connector. The first substrate is deflectable according to the movement of the connector relative to the actuating assembly.

In another embodiment of the present invention, a multiplicity of adjustment points on different locations of a substrate facilitate the application of pushing and pulling forces to the substrate.

In another embodiment of the present invention, a multiplicity of substrates, with a multiplicity of adjustment points on different locations of each substrate, the adjustment points including the capability for translating and rotation of each substrate relative to one another, as well as facilitating the application of pushing and pulling forces to each of the multiplicity of substrates, are combined in a common assembly to create a larger contact system.

Additional features and benefits of the present invention will become apparent upon review of the following description.

BRIEF DESCRIPTION OF THE DRAWINGS

Various embodiments of the present invention will be described in detail with reference to the following drawings in which like reference numerals refer to like elements. The present invention is illustrated by way of example and not limitation in the accompanying figures. It should be noted that many of the features shown in the figures have not been drawn to scale for the purpose of better illustrating such features.

FIG. 6 illustrates multiple adjustable substrates of a probe card assembly.

FIG. 7A illustrates a top view of a multiple substrate assembly in accordance with the teachings of the present invention.

FIG. 7B illustrates a side view of the multiple substrate assembly shown in FIG. 7A.

DETAILED DESCRIPTION

The following description provides embodiments of the present invention. However, it will be appreciated that other embodiments of the present invention will become apparent to those of ordinary skill in the art upon examination of this description. Thus, the present description and accompanying drawings are for purposes of illustration and are not to be used to construe the invention in a restrictive manner.

In a preferred embodiment of the present invention, a probe card assembly includes a probe card, an interposer, a space transformer, a drive plate and a first control member. The interposer is located between the probe card and the space transformer. The drive plate is located adjacent to the probe card. A protrusion extends from a central area of the bottom surface of the space transformer and through a through hole in the interposer. The first control member is coupled to the protrusion and is disposed within the through hole in the interposer and through holes in the probe card and drive plate. The first control member has an actuating component rotatably coupled to an end of the first control member that is accessible from an exposed side of the drive plate. A spring is supported by the actuating component to be urged against the drive plate. As the actuating component is rotated and moved toward the drive plate, the spring is pressed against the drive plate and provides a resistance to the movement of the actuating component. During this time, the space transformer is pulled toward the interposer via the first control member coupled to the protrusion extending from the space transformer. Thus, a non-peripheral area of the space transformer is deflected according to a preferred embodiment of the present invention.

Figure 2:
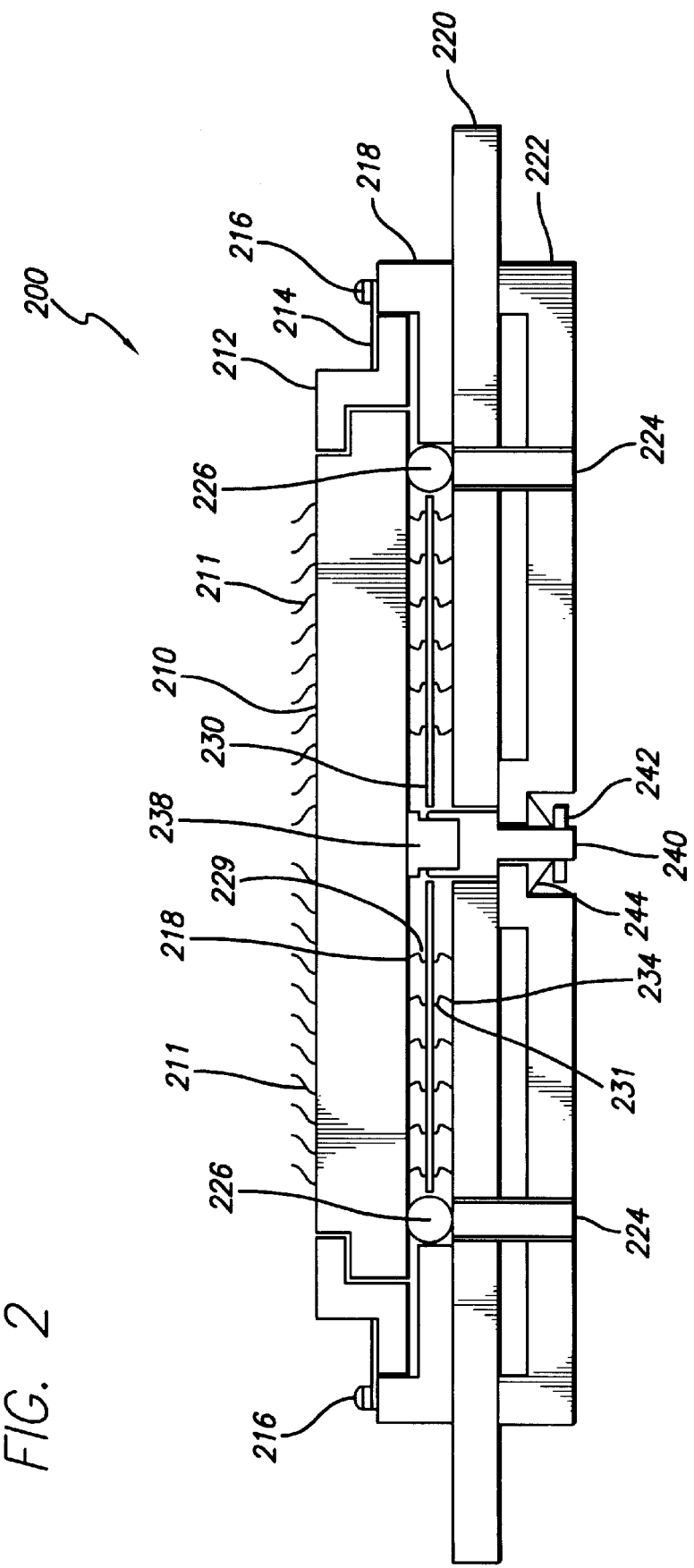
FIG. 2 illustrates a cross-sectional view of a probe card assembly in accordance with the teachings of the present invention.

FIG. 2 illustrates a side cross-sectional view of a probe card assembly 200 in accordance with the teachings of the present invention. A space transformer 210 is held down at its periphery by a clamping frame 212. The top of space transformer 210 may be substantially flush with the top of frame 212 such that a plurality of resilient contact structures 211 extending from the top of space transformer 210 can extend above the top surface of frame 212.

Contact structures 211 each have a contact region for making contact with the terminals of an electronic component (e.g. bond pads on a semiconductor device). In one embodiment, contact structures 211 are free-standing, springable contact elements. It is appreciated that other contact elements can be used in place of contact structures 211. It is preferred that such elements are sufficiently coupled to space transformer 210 to benefit from the planarizing action associated with the present invention. For example, posts, pins, pads, terminals and bumps/balls or other contact elements known in the art can be used as contact elements.

A clamping spring 214 (e.g. leaf spring) is coupled to a frame 218 by screws 216. Spring 214 secures frame 212. A printed wiring board 220, such as probe card, is located beneath frame 218 and has a through hole in its center and through holes at points around the center in a regular pattern. A drive plate 222, which can also act as a stiffening substrate, is coupled to the bottom of board 220. Drive plate 222 has a set of through holes which align with the through holes in board 220. Screws 224 are placed in the outer through holes in both board 220 and drive plate 222. Ball bearings 226 rest on an end of screws 224 and are pressed against space transformer 210 when screws 224 are screwed toward space transformer 210.

An interposer 230 is located between space transformer 210 and board 220. Interposer 230 has a central through hole. Resilient contact structures 229 extend from the top of interposer 230 and effect pressure connections with contact pads 228 located on space transformer 210. Resilient contact structures 231 extend from the bottom of interposer 230 and effect pressure connections with contact terminals 234 located on board 220. A threaded protrusion or stud 238 extends from the bottom of space transformer 210. Stud 238 may be coupled to space transformer 210 or integrally formed with space transformer 210. An extension stud 240 has a threaded bore in one end which is screwed onto stud 238. The other end of stud 240 is threaded and accommodates an actuating nut 242. Stud 240 is disposed through the central through holes of interposer 230, board 220 and drive plate 222. A spring element 244 (e.g. Belleville washer) is supported by nut 242 and is pressed against drive plate 222 as nut 242 is moved up stud 240.

It is appreciated that a plurality of resilient contact structures can be provided on the bottom surface of a space transformer (e.g. fabricated on the terminals on the bottom surface of a space transformer) to make direct contact to the terminals on the top surface of a printed wiring board. Thus, the use of an interposer is optional. One alternative to an interposer is a semi-rigid support member that backs a flexible sheet incorporating contact structures. The semi-rigid support member, and hence the flexible sheet and contact structures, can be planarized in accordance with the teachings of the present invention. Other alternatives to an interposer include flex tape, pogo pins and other socket or interconnect constructions.

More detailed discussions of printed wiring boards (e.g., probe cards), interposers, space transformers, drive plates, resilient contact structures, contact elements and other components of a probe card assembly that can be used in conjunction with the present invention can be found in U.S.

Pat. No. 5,974,662, U.S. patent application Ser. No. 08/920,255, titled "Making Discrete Power Connections to a Space Transformer of a Probe Card Assembly," now U.S. Pat. No. 6,050,829, and U.S. patent application Ser. No. 09/042,606, titled "Probe Card Assembly and Kit," all of which are incorporated by reference herein.

The planarity of space transformer 210 can be adjusted via peripheral control members (e.g. screws 224 and ball bearings 226) and a non-peripheral control member (e.g. stud 240 coupled to stud 238).

For example, screws 224 can be accessed from the bottom side of drive plate 222 to drive them upward and force ball bearings 226 against space transformer 210. Because space transformer 210 is held by frame 212 and spring 214, the contact of ball bearings 226 against space transformer 210 subjects space transformer 210 to compressive forces. Thus, when ball bearings 226 are pressed against space transformer 210, space transformer 210 deflects accordingly. Because ball bearings 226 are located near the periphery of space transformer 210, only peripheral areas of space transformer 210 are adjustable via screws 224 and ball bearings 226. Furthermore, because screws 224 are accessible from an exposed side of drive plate 222, the planarity of peripheral areas of space transformer 210 is remotely adjustable. It should be noted that screws 224 and ball bearings 226 can be used to deflect space transformer 210 without interfering with interposer 230.

A central area of space transformer 210 can be deflected through the actuation of nut 242. As nut 242 is turned and moves up extension stud 240, spring element 244 is pressed against drive plate 222 by nut 242. Spring element 244 provides a resistance to the upward movement of nut 242. Thus, as nut 242 is turned around the threads of stud 240 and urged against spring element 244, stud 240 is pulled down. Because stud 240 is coupled to stud 238, the area of space transformer 210 where stud 238 is located is also pulled down along with stud 240. Thus, such area of space transformer 210 is subjected to a pulling force or tensile force. If space transformer 210 is bowed (e.g. domed), then stud 240 can be pulled down through the actuation of nut 242 to adjust the planarity of space transformer 210. It should be noted that because nut 242 is accessible from an exposed side of drive plate 222, the planarity of a non-peripheral area of space transformer 210 is remotely adjustable. It should be further noted that studs 238 and 240 can be used to deflect space transformer 210 without interfering with interposer 230.

Stud 238 can be located at a variety of positions on the bottom surface of space transformer 210. For example, stud 238 can be located near the center or the edge of the bottom surface of space transformer 210. Thus, it is appreciated that the planarizing apparatus of the present invention can be used to deflect peripheral areas, as well as non-peripheral areas, of a substrate in a probe card assembly. Furthermore, multiple studs can be used. A space transformer can be configured to use a system in which as many as all of the studs or other elements fixed to the space transformer provide pushing and pulling forces through an actuating mechanism to effect the desired deformation of a surface of the space transformer.

Screws 224 and ball bearings 226 cannot be used to pull down a central area of space transformer 210 because they are configured to function with an opposing spring against space transformer 210. The planarizing apparatus of the present invention addresses such a deficiency as described above. Thus, the planarity of space transformer 210 can be more thoroughly adjusted, particularly on a higher order of adjustment (e.g. $2^{nd}$ order polynomial, $3^{rd}$ order polynomial, etc.), with the planarizing apparatus of the present invention.

In addition to being able to adjust the planarity of space transformer 210, the planarizing apparatus of the present invention can be used to deflect space transformer 210 such that the contact regions of contact structures 211 are planarized relative to one another. The planarization of the contact regions of contact structures 211 allows more uniform contact to be made with the terminals of an electronic component to facilitate testing of the electronic component. Furthermore, the deflection of space transformer 210 can effect more uniform contact between contact pads 228 and contact structures 229, and between terminals 234 and contact structures 231.

Figure 1:
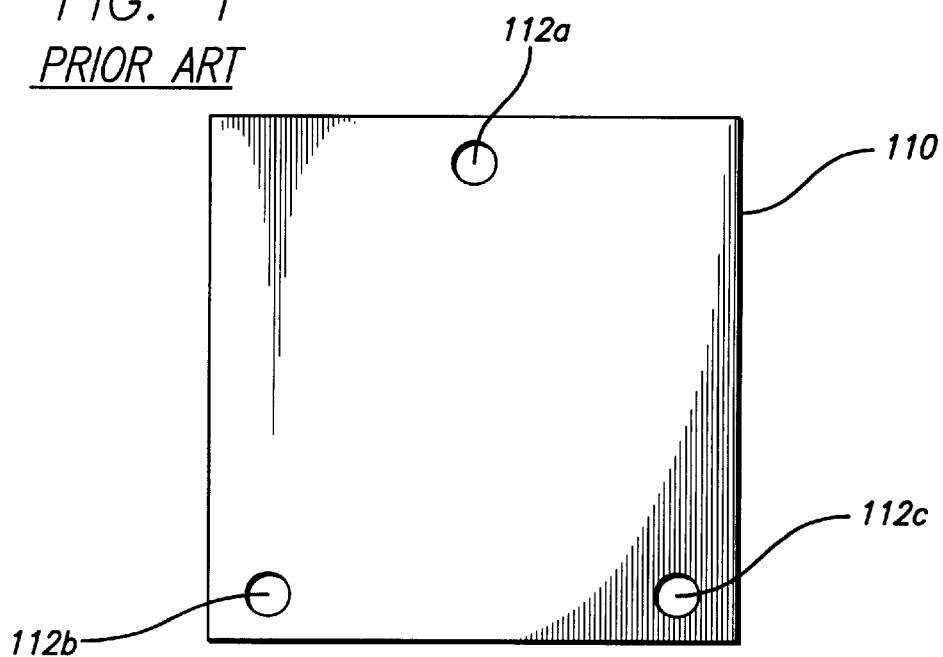
FIG. 1 illustrates generally a prior art technique for adjusting the planarity of a space transformer in probe card assembly.
Figure 3A:
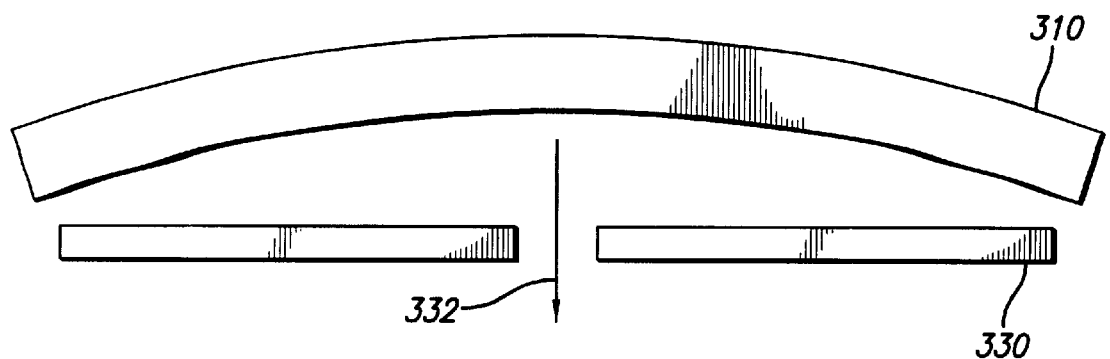
FIGS. 3A and 3B illustrate generally deflections of a substrate in a probe card assembly in accordance with the teachings of the present invention.
Figure 3B:
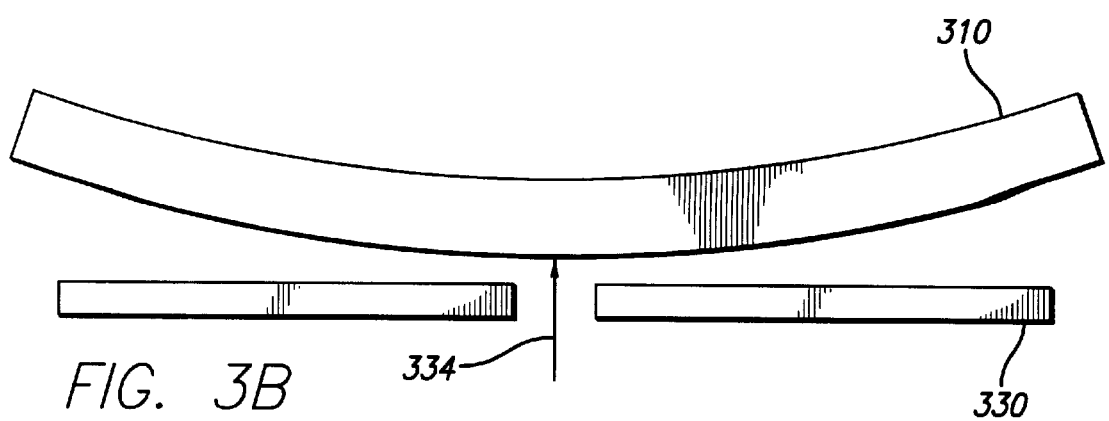

FIGS. 3A and 3B illustrate generally a bowed substrate 310, such as a space transformer, which is typically located in a probe card assembly. If substrate 310 is bowed as shown in FIG. 3A, then a force 332 (e.g. tensile force) which does not directly affect an adjacent interposer 330 can be applied to substrate 310 to pull substrate 310 into a desired position. Specifically, a central area of substrate 310 can be deflected to a desired planarity. Such a pulling force can be applied as previously described in conjunction with FIG. 2. If substrate 310 is bowed as shown in FIG. 3B, then a force 334 (e.g. compressive force) which does not affect interposer 330 can be applied to substrate 310 to push substrate 310 into a desired position. Specifically, a central area of substrate 310 can be deflected to a desired planarity. Such a pushing force can be applied using an embodiment of the present invention as shown in FIG. 5C.

Figure 4A:
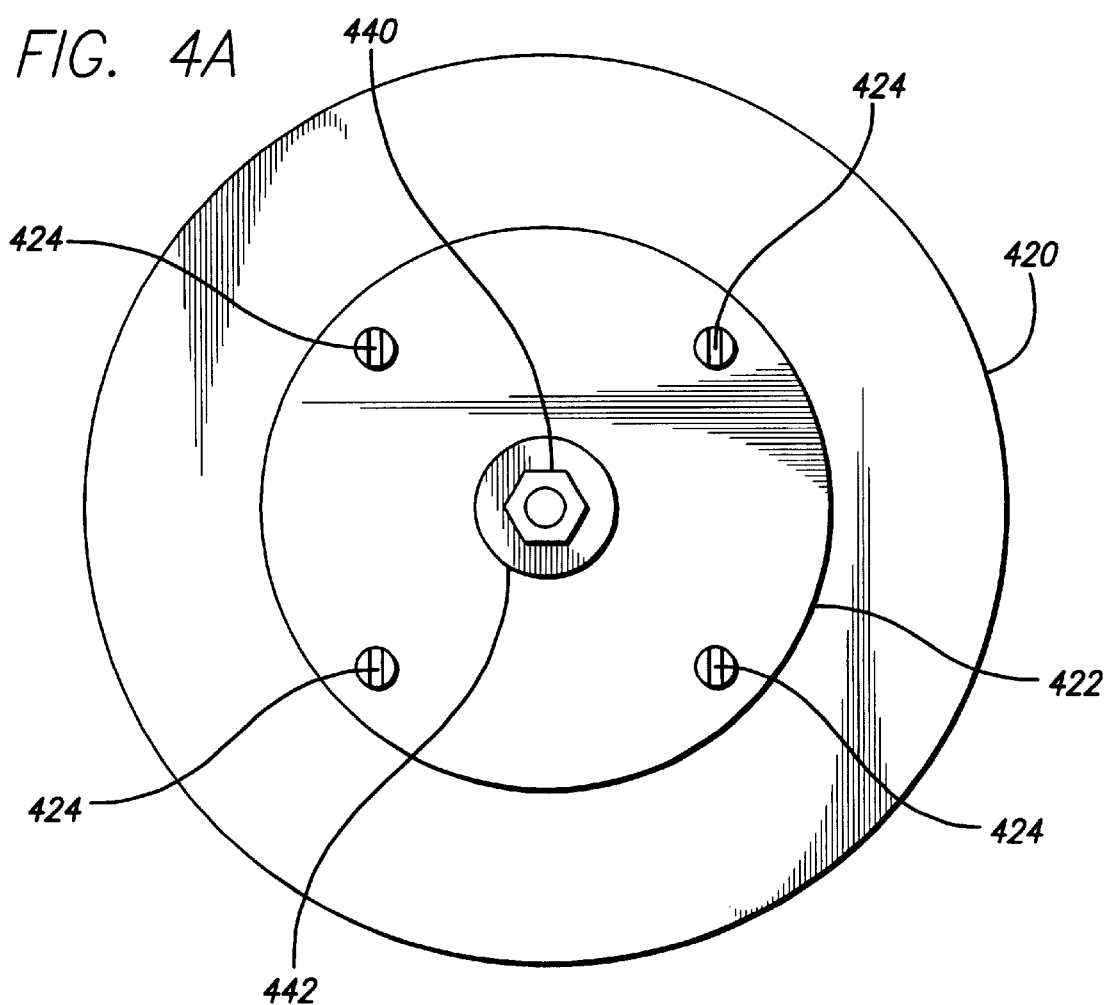
FIG. 4A illustrates a bottom view of a probe card assembly in accordance with the teachings of the present invention.
Figure 4B:
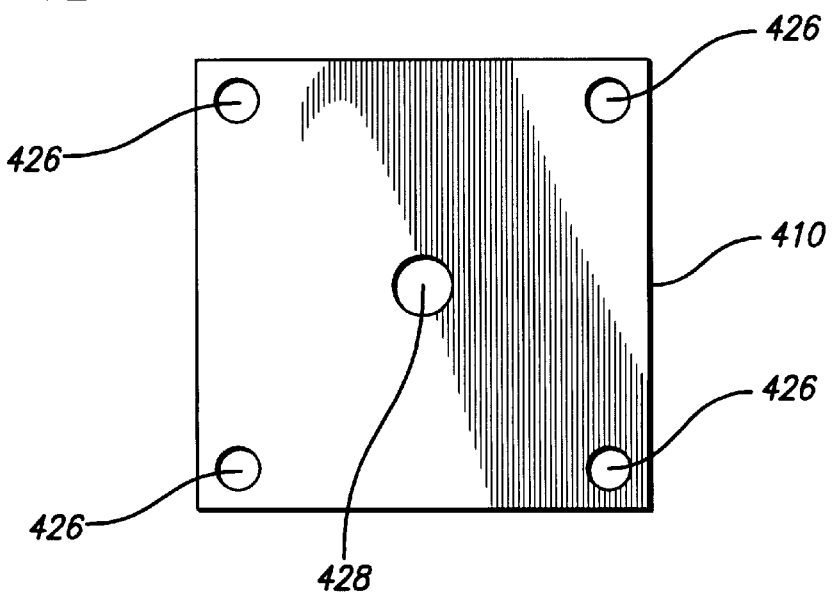
FIG. 4B illustrates a bottom view of a substrate in the probe card assembly shown in FIG. 4A.

FIG. 4A illustrates a bottom view of a probe card assembly fitted with push-only control members 424, which are similar to screws 224, and a push-pull control member 440, which is similar to extension stud 240. A drive plate 422 is coupled to a probe card 420. Both drive plate 422 and probe card 420 have through holes to accommodate control members 424 and 440. Control members 424 drive ball bearings 426 at corresponding locations of a substrate 410, as shown in FIG. 4B. Substrate 410, such as a space transformer, is typically part of a probe card assembly such as that shown in FIG. 2. A stud 428 extending from the surface of substrate 410 is coupled to central control member 440 to allow a central area of substrate 410 to be deflected by the actuation of a nut 442 relative to control member 440. Control members 424 and 440 can be driven independently to adjust the planarity of substrate 410 in a variety of ways.

Figure 5A:
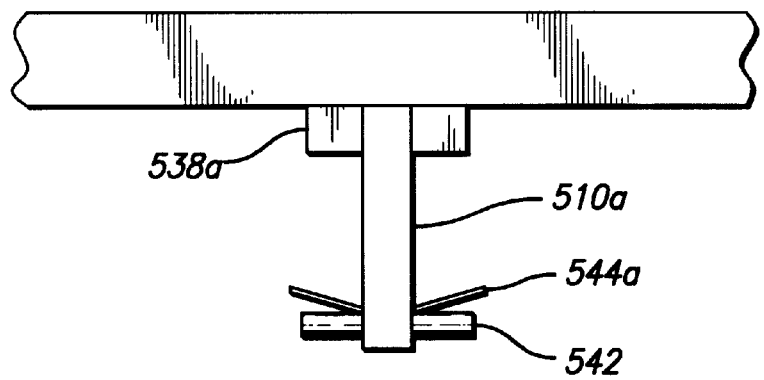
FIGS. 5A–5C illustrate different embodiments of a planarizing element for a probe card assembly in accordance with the teachings of the present invention.
Figure 5B:
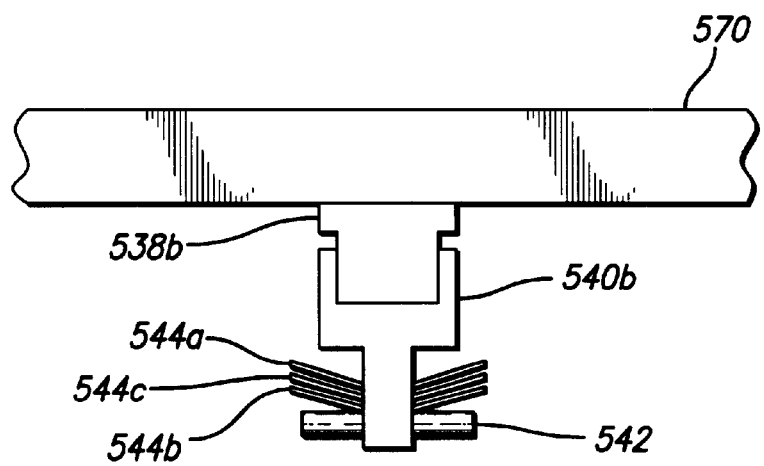
Figure 5C:
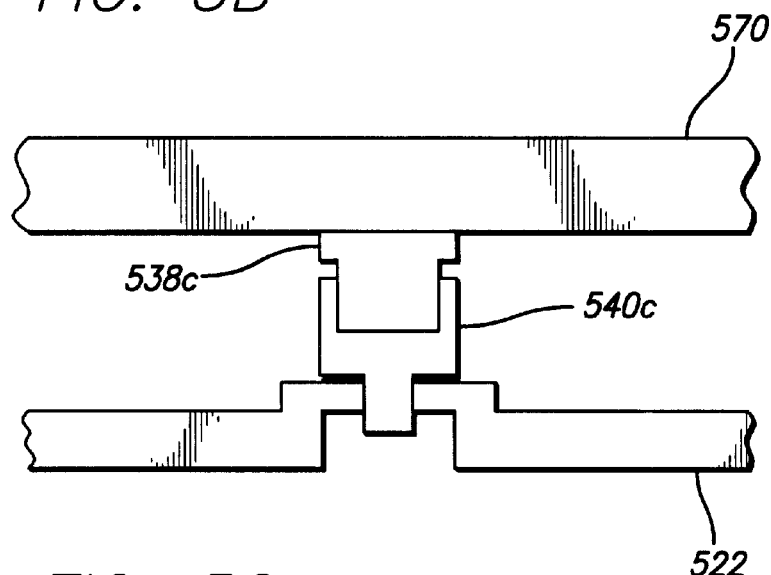

FIGS. 5A–5C illustrate various embodiments of a planarizing apparatus according to the present invention. In FIG. 5A, a substrate 510, such as a space transformer, has a stud 538a coupled to or integrally formed with the bottom surface of substrate 510. Stud 538a has a threaded bore to accommodate a connector 540a having threaded ends. A nut 542 coupled to one of the threaded ends of connector 540a supports a spring element 544a, which can be pressed against a substrate (not shown), such as a drive plate, in a manner similar to that described in conjunction with FIG. 2. The actuation of nut 542 relative to connector 540a and the resulting resistance provided by spring element 544a help drive connector 540a down, thereby deflecting substrate 510. Spring element 544a is shown as a Belleville washer. It is appreciated that other springs elements, such as coil springs and wavy washers could be used in lieu of a Belleville washer. Furthermore, the spring element could be built into the bottom of the drive plate.

In FIG. 5B, substrate 510 has a threaded stud 538b coupled to or integrally formed with the bottom surface of substrate 510. A connector 540*b* with a threaded bore is coupled to stud 538*b*. A nut 542 coupled to a threaded end of connector 540*b* supports spring elements 544*b*–544*d* against a substrate (not shown), such as a drive plate. Different spring elements can be used as spring elements 544*b*–544*d* to provide varying resistances to nut 542 as nut 542 is twisted along the threads of connector 540*b* toward space transformer 510.

In FIG. 5C, substrate 510 has a threaded stud 538*c* coupled to or integrally formed with the bottom surface of substrate 510. A connector 540*c* with a threaded bore is coupled to stud 538*c*. A threaded end of connector 540*c* is coupled to a threaded through hole in a substrate 522, such as drive plate. Connector 540*c* is accessible from an exposed side of substrate 522, which is typically an exterior substrate of a probe card assembly. Connector 540*c* can be turned clockwise or counter-clockwise to deflect substrate 510 in opposite directions.

It should be noted that a multipoint adjustment scheme according to the present invention can also be used to modify the orientation (e.g. in x, y and θ directions) of a substrate in a probe card assembly with respect to other substrates in the assembly without interfering with the planarity or orientation of such other substrates. Accordingly, a probe card assembly having multiple deformable substrates may be constructed and made planar across the surface defined by their contact elements with respect to a test substrate, while appropriate positions of the contact elements from substrate to substrate are maintained. Such an assembly is shown generally in FIG.

Multiple substrates 610, 620 . . . n are located adjacent to one another in a combined assembly. Each substrate is adjustable with respect to the other substrates in x, y and θ using orienting mechanisms (not shown) well known in the art. A system for deforming substrates in the z direction (out of the page) is also included but is not shown. Such a system may incorporate planarizing elements as disclosed herein. The vector r defines the relationship between corresponding contact elements 610*a*, 620*a* . . . z on multiple substrates 610, 620 . . . n, respectively. Substrates 610, 620 . . . n are positioned with respect to one another such that r is within a desired degree of accuracy, and deformed such that the contact tips of contact elements 610*a*, 620*a* . . . z are coplanar within a desired degree of accuracy in the z direction.

Referring to FIGS. 7A and 7B, which provide more detailed representations of a combined assembly having multiple substrates similar to that shown in FIG. 6, contact elements 711 are secured to insulating support member 705. Contact elements 711 are electrically connected by traces 706 to connecting wires 715, which are connected in turn to traces 713 and to tester 760. Contact elements 711 are illustrated as solder balls but of course can take many of the forms described herein. In one preferred embodiment, connecting wires 715 are portions of a multi-stranded flex cable. In another preferred embodiment, connecting wires 715 can be wirebonded connections. In still another preferred embodiment, insulating support member 705 is polyimide, or other flex materials well known in the art.

Substrate 704 supports insulating support member 705. In one preferred embodiment, they are secured together. In another preferred embodiment, they can be in close contact, but can move relative to each other. Substrate 704 is positioned by a push-only control element comprising actuator 730 acting on element 724 and ball 726 to press against substrate 704, opposed by spring 712, which in turn is secured to substrate frame 720. Several of these push control elements can be used; two are shown in FIG. 7B for illustrative purposes. Substrate 704 also is positioned by a push-pull control element comprising actuator 732, element 740, and stud 738, which is secured to substrate 704. Substrate frame 720 is secured to substrate housing 722, which in turn is connected to actuators 730, 732, forming a closed loop system. By selectively positioning the actuators, the shape of substrate 704 can be controlled.

Printed wiring board 750 supports housing 752, which is connected to positioning element 756, which in turn is connected to substrate housing 722 directly or, as shown, through bridge housing 754. Positioning element 756 is illustrated in stylized form and can include elements as desired to provide x, y, z, and three degrees of positional control over substrate housing 722.

FIG. 7B illustrates a second substrate 704*a* as well, with elements as described above. Each substrate 704, 704*a* can be adjusted to a desired degree of planarity. Equally well, each substrate 704, 704*a* can be adjusted to a desired degree of flatness of the contact region portion of each of contact elements 711. Moreover, substrates 704 and 704A can be positioned relative to each other to provide a relatively large array of contact elements 711.

Such a probe card assembly constructed of multiple deformable substrates is functionally equivalent to a larger probe card assembly having a much larger (equivalent in area) single substrate. It is important to note that deformation of the monolithic substrate in order to change the spatial relationship of the contact elements residing on it is achieved both by deformation and x, y, z, and θ movement of the multiple substrates and supporting structures in which they reside.

The planarizing apparatus of the present invention can be manually actuated or automatically actuated. For example, an actuator mechanism can be connected to a planarizing apparatus (e.g. to the actuating nut) and operated according to signals from a computer system. A greater number of control points driven by such automated planarizing apparatuses can shape a substrate to a higher degree of accuracy.

Although the present invention has been described with particular reference to probe card assemblies and space transformers in particular, it is appreciated that the present invention is not so limited in its applications.

In the foregoing detailed description, the apparatus and method of the present invention have been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. A probe card assembly comprising:
    a substrate having a first surface, wherein the first surface has an area that includes a central region and at least one peripheral region, wherein each peripheral region is located further from a center of said substrate than said central region;
    a plurality of contact elements coupled to said first surface of said substrate; and
    at least one planarizing element capable of transmitting a force to the central region of said substrate to modify a shape of the first surface at said central region relative to a shape of said first surface at each peripheral region, whereby, the first surface can be made planar.

2. A probe card assembly as in claim 1 wherein each of said contact elements has a contact region, and wherein said at least one planarizing element applies a force to the central region relative to each peripheral region such that said contact regions are planarized relative to one another.

3. A probe card assembly as in claim 1 wherein said plurality of contact elements comprises free-standing spring elements.

4. A probe card assembly as in claim 1 further comprising an automated actuator coupled to said at least one planarizing element.

5. A probe card assembly as in claim 1,
wherein said at least one planarizing element comprises at least four control elements disposed relative to a printed wiring board in the probe card assembly such that each control element can transmit force to a respective area of said substrate and to a respective area of said printed wiring board.

6. A substrate as in claim 5 wherein said plurality of contact elements are configured to contact a plurality of terminals on a semiconductor device.

7. A probe card assembly as in claim 5 wherein said substrate comprises a space transformer.

8. A probe card assembly as in claim 7 wherein at least one of said control elements comprises:
a stud having a first end and a second end, said first end having a bore mateable with a protrusion on a second surface of said space transformer; and
an actuating component coupled to said second end of said stud.

9. A probe card assembly as in claim 8 wherein said actuating component is rotatably coupled to said second end of said stud.

10. A probe card assembly as in claim 7 wherein said control elements are controllable by a computer system.

11. An interposer for use with a probe card assembly, the interposer comprising:
an opening in a central region of the interposer, wherein said opening can be aligned with a central region of a space transformer in the probe card assembly, the opening being capable of receiving an actuating assembly for deflecting a central region of a space transformer in the probe card assembly such that a first surface of the space transformer is deflected at said space transformer central region compared to at least one peripheral region of the space transformer.

12. A probe card assembly comprising:
a space transformer having a first surface, wherein the first surface has an area that includes a central region and at least one peripheral region, wherein each peripheral region is located further from a center of said space transformer than said central region;
a plurality of contact elements, coupled to said first surface of said space transformer;
an adjustable central control member capable of transmitting a force to the central region of said space transformer to modify a shape of the first surface at said central region relative to a shape of said first surface at each peripheral region; and
at least one adjustable peripheral control member, wherein each adjustable peripheral control member is capable of transmitting a respective force to a respective peripheral region of said space transformer to modify a shape of the first surface at the respective peripheral region relative to a shape of said first surface at the central region.

13. The probe card assembly of claim 12, further comprising an interposer coupled to said space transformer and having an opening in a central region of the interposer, wherein said adjustable central control member is positioned to extend through the opening in said interposer.

14. The probe card assembly of claim 12, wherein said adjustable central control member comprises an adjustable push/pull control member capable of transmitting a push force and a pull force to the central region of said space transformer, wherein the push force is a force applied along a direction extending from the push/pull control member toward the space transformer, and the pull force is a force applied along a direction extending from the space transformer toward the push/pull control member.

15. The probe card assembly of claim 14, wherein each adjustable peripheral control member comprises an adjustable push control member capable of transmitting a push force to a respective peripheral region of said space transformer, wherein the push force is a force applied along a direction extending from the push control member toward the space transformer.

16. The probe card assembly of claim 15, further comprising:
a printed wiring board that is electrically coupled to said space transformer; and
a drive plate coupled to said printed wiring board; wherein said adjustable push/pull control member is coupled between said space transformer and said drive plate, and each adjustable push control member is coupled between said space transformer and said drive plate, whereby, said drive plate helps provide resistance such that said adjustable push/pull control member is capable of pushing and pulling said space transformer away from and toward said drive plate and each adjustable push control member is capable of pushing said space transformer away from said drive plate.

17. The probe card assembly of claim 16, where in said adjustable push/pull control member includes an extension stud having a first end that can be coupled to said space transformer and a second end that can be coupled to said drive plate.

18. The probe card assembly of claim 17, wherein said adjustable push/pull control member further includes an actuating element coupled between said second end of said extension stud and said drive plate.

19. The probe card assembly of claim 18, wherein said adjustable push/pull control member further includes a spring element coupled between said actuating element and said drive plate, and wherein said actuating element comprises an actuating nut, whereby, rotation of said actuating nut adjusts the deflection of said space transformer.

20. The probe card assembly of claim 16, wherein said adjustable push/pull control member includes an extension stud having a first threaded end that can be coupled to said space transformer and a second threaded end that can be coupled to said drive plate.

21. The probe card assembly of claim 20, further comprising a threaded stud coupled between said space transformer and said first threaded end of said extension stud.

22. The probe card assembly of claim 15, wherein at least one of said adjustable push control members includes a screw coupled to a ball bearing.

23. A probe card assembly comprising:
a plurality of substrates, each substrate having a central region and at least one peripheral region, wherein each peripheral region is located further from a center of a respective substrate than said central region; and a plurality of planarizing elements that control the planarity of respective ones of said substrates; wherein each planarizing element comprises:

an adjustable central control member capable of transmitting a force to the central region of said substrate to modify a shape of the respective substrate at said central region relative to a shape of the respective substrate at each peripheral region; and at least one adjustable peripheral control member, wherein each adjustable peripheral control member is capable of transmitting a respective force to a respective peripheral region of said substrate to modify a shape at the respective peripheral region relative to a shape at the central region.

24. A probe card assembly comprising:

a substrate having a central region and at least one peripheral region, wherein each peripheral region is located further from a center of said substrate than said central region;

a plurality of contact elements, coupled to said substrate;

an adjustable central control member capable of transmitting a force to the central region of said substrate to modify a shape at said central region relative to a shape at each peripheral region; and at least one adjustable peripheral control member, wherein each adjustable peripheral control member is capable of transmitting a respective force to a respective peripheral region of said substrate to modify a shape at the respective peripheral region relative to a shape at the central region.

25. A probe card assembly of claim 24, wherein said substrate comprises a space transformer.

* * * * *

UNITED STATES PATENT AND TRADEMARK OFFICE
CERTIFICATE OF CORRECTION

PATENT NO. : 6,509,751 B1
DATED : January 21, 2003
INVENTOR(S) : Mathieu et al.

It is certified that error appears in the above-identified patent and that said Letters Patent is hereby corrected as shown below:

<u>Title page,</u>
Item [56], References Cited, please add the following cited references:
-- U.S. Patent No. 4,947,481
U.S. Patent No. 5,148,103
U.S. Patent No. 5,642,054
U.S. Patent No. 5,828,226
U.S. Patent No. 6,040,700
U.S. Patent No. 6,043,668
U.S. Patent No. 6,087,840
U.S. Patent No. 6,144,212
U.S. Patent No. 6,160,412
U.S. Patent No. 6,166,552
U.S. Patent No. 6,189,876 B1
European Patent Publication No. 802419
Japanese Patent Publication No. 529406
Japanese Patent Publication No. 650990 --

Signed and Sealed this

Tenth Day of June, 2003

JAMES E. ROGAN
*Director of the United States Patent and Trademark Office*